(12) United States Patent
Janardan et al.

(10) Patent No.: US 10,311,944 B2
(45) Date of Patent: *Jun. 4, 2019

(54) SRAM READ MULTIPLEXER INCLUDING REPLICA TRANSISTORS

(71) Applicant: STMicroelectronics International N.V., Schiphol (NL)

(72) Inventors: Dhori Kedar Janardan, Ghaziabad (IN); Abhishek Pathak, Nowgong (IN); Shishir Kumar, Greater Noida (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

This patent is subject to a terminal disclaimer.

(21) Appl. No.: 16/025,647

(22) Filed: Jul. 2, 2018

(65) Prior Publication Data

US 2019/0035454 A1    Jan. 31, 2019

Related U.S. Application Data

(63) Continuation of application No. 15/660,371, filed on Jul. 26, 2017, now Pat. No. 10,037,794.

(51) Int. Cl.
*G11C 5/06* (2006.01)
*G11C 11/417* (2006.01)

(52) U.S. Cl.
CPC ................................ *G11C 11/417* (2013.01)

(58) Field of Classification Search
CPC .................................................... G11C 11/417

USPC .......................................................... 365/72
See application file for complete search history.

(56) References Cited

U.S. PATENT DOCUMENTS

| | | | | |
|---|---|---|---|---|
| 4,954,987 A * | 9/1990 | Auvinen | ............... | G11C 7/1021 365/189.02 |
| 5,276,650 A * | 1/1994 | Kubota | ..................... | G11C 7/18 365/189.02 |
| 5,633,828 A | 5/1997 | McClure et al. | | |
| 5,969,995 A | 10/1999 | Morishima | | |
| 6,711,067 B1 * | 3/2004 | Kablanian | ................ | G11C 7/12 365/154 |
| 2006/0256605 A1 | 11/2006 | Joshi | | |
| 2008/0279017 A1 | 11/2008 | Shimano et al. | | |

* cited by examiner

*Primary Examiner* — Tha-O H Bui
(74) *Attorney, Agent, or Firm* — Crowe & Dunlevy

(57) ABSTRACT

A first transistor has a first conduction terminal coupled to a second bit line, a second conduction terminal coupled to a bit line node, and a control terminal biased by a second control signal. A second transistor has a first conduction terminal coupled to a second complementary bit line, a second conduction terminal coupled to a complementary bit line node, and a control terminal biased by the second control signal. A first replica transistor has a first conduction terminal coupled to the second bit line, a second conduction terminal coupled to the complementary bit line node, and a control terminal biased such that the first replica transistor is off. A second replica transistor has a first conduction terminal coupled to the second complementary bit line, a second conduction terminal coupled to the bit line node, and a control terminal biased such that the second replica transistor is off.

21 Claims, 5 Drawing Sheets

SRAM READ MULTIPLEXER INCLUDING REPLICA TRANSISTORS

CROSS REFERENCE TO RELATED APPLICATION

This application is a continuation of U.S. patent application Ser. No. 15/660,371 filed Jul. 26, 2017, now U.S. Pat. No. 10,037,794, the disclosure of which is incorporated by reference.

TECHNICAL FIELD

This application is directed to the field of static random access memory (SRAM) circuits, and in particular, to a SRAM circuit that utilizes replica transistors to compensate for currents injected into bit lines through parasitic capacitances.

BACKGROUND

A prior art SRAM memory circuit 50 is now described with reference to FIG. 1A. The SRAM memory circuit 50 includes first and second columns 52 and 54. The first column 52 includes memory cell 51 with a bitline BL0 and complementary bitline BLB0 associated therewith. The second column 54 includes memory cell 53 with bitline BL1 and complementary bitline BLB1 associated therewith. The column selection circuit 60 includes a PMOS transistor M1 with its source coupled to complementary bitline BLB0, its drain coupled to node INN, and its gate biased by control signal CTRL1. PMOS transistor M2 has its source coupled to bitline BL0, its drain coupled to node INP, and its gate biased by control signal CTRL1.

The column selection circuit 60 further includes a PMOS transistor M3 has its source coupled to complementary bitline BLB1, it drain coupled to node INN, and its gate biased by control signal CTRL2. PMOS transistor M4 has its source coupled to bitline BL1, its drain coupled to node INP, and its gate biased by control signal CTRL2.

Nodes INN and INP serve as the outputs of the column selection circuit 60 and the inputs to sense amplifier 55. In operation, one column 52 or 54 is selected by the column selection circuit 60 while the other column 52 or 54 is unselected. In the example operation state shown in FIG. 1A, column 52 is selected while column 54 is deselected. This is accomplished by control signal CTRL1 going low to turn on bitline select transistors M1 and M2, while control signal CTRL2 goes high or remains high to turn off bitline select transistors M3 and M4.

In an ideal case, as can be seen in FIG. 1B, when bitline BL0 and complementary bitline BLB0 are selected by transistors M1 and M2 being turned on where BL0 is to output a logic 1 and BLB1 is to output a logic 0, the voltage at node INP remains at VDD, while the voltage at node INN falls, with the difference between the two being Vdiff.

However, operation of the prior SRAM memory circuit 50 is not necessarily ideal. Although transistors M3 and M4 are turned off, there is a parasitic capacitance CP1 between the source of transistor M4 and node INP. As can be seen in FIG. 1B, since cell 53 stores a "0" value so BL1 discharges and due the parasitic capacitance CP1 between BL1 and INP node, node INP does not remain at VDD, but discharges which results in loss of effective Vdiff. The discharge current on BL1 through MEMCELL1 discharges INP due to the CP1 parasitic capacitor. Thus, the difference Vdiff between the voltages at INP and INN reduces by ΔV. This may cause an error when the bit lines BL0 and BLB0 are read.

This is an undesirable situation. Therefore, further development in the area of SRAM memory circuits is needed.

SUMMARY

Disclosed herein is an electronic device including a first column configured to be selectable by a first control signal, and a second column selectable by second control signal. The second column includes a second memory cell and a second bit line associated with the second memory cell. A first transistor has a first conduction terminal coupled to the second bit line, a second conduction terminal coupled to a bit line node, and a control terminal biased by a second control signal. A second transistor has a first conduction terminal coupled to the second complementary bit line, a second conduction terminal coupled to a complementary bit line node, and a control terminal biased by the second control signal. A first replica transistor that is a replica of the first transistor has a first conduction terminal coupled to the second bit line, a second conduction terminal coupled to the complementary bit line node, and a control terminal biased such that the first replica transistor is always off or at least when the second control signal selects the second column. A second replica transistor is a replica of the second transistor and has a first conduction terminal coupled to the second complementary bit line, a second conduction terminal coupled to the bit line node, and a control terminal biased such that the second replica transistor is always off or at least when the second control signal selects the second column.

The control terminals of the first and second replica transistors may be biased such that the first and second replica transistors are always off.

The first column may include a first memory cell, a first bit line associated with the first memory cell, and a first complementary bit line associated with the first memory cell. A third transistor may have a first conduction terminal coupled to the first bit line, a second conduction terminal coupled to the bit line node, and a control terminal biased by the first control signal. A fourth transistor may have a first conduction terminal coupled to the first complementary bit line, a second conduction terminal coupled to the complementary bit line node, and a control terminal biased by the first control signal.

A third replica transistor that is a replica of the third transistor may have a first conduction terminal coupled to the first bit line, a second conduction terminal coupled to the complementary bit line node, and a control terminal biased such that the third replica transistor is off at least when the first control signal selects the first column. A fourth replica transistor that is a replica of the fourth transistor may have a first conduction terminal coupled to the first complementary bit line, a second conduction terminal coupled to the bit line node, and a control terminal biased such that the fourth replica transistor is off at least when the first control signal selects the first column.

The control terminals of the third and fourth replica transistors may be biased such that the first and second replica transistors are always off.

DETAILED DESCRIPTION

Figure 1A:
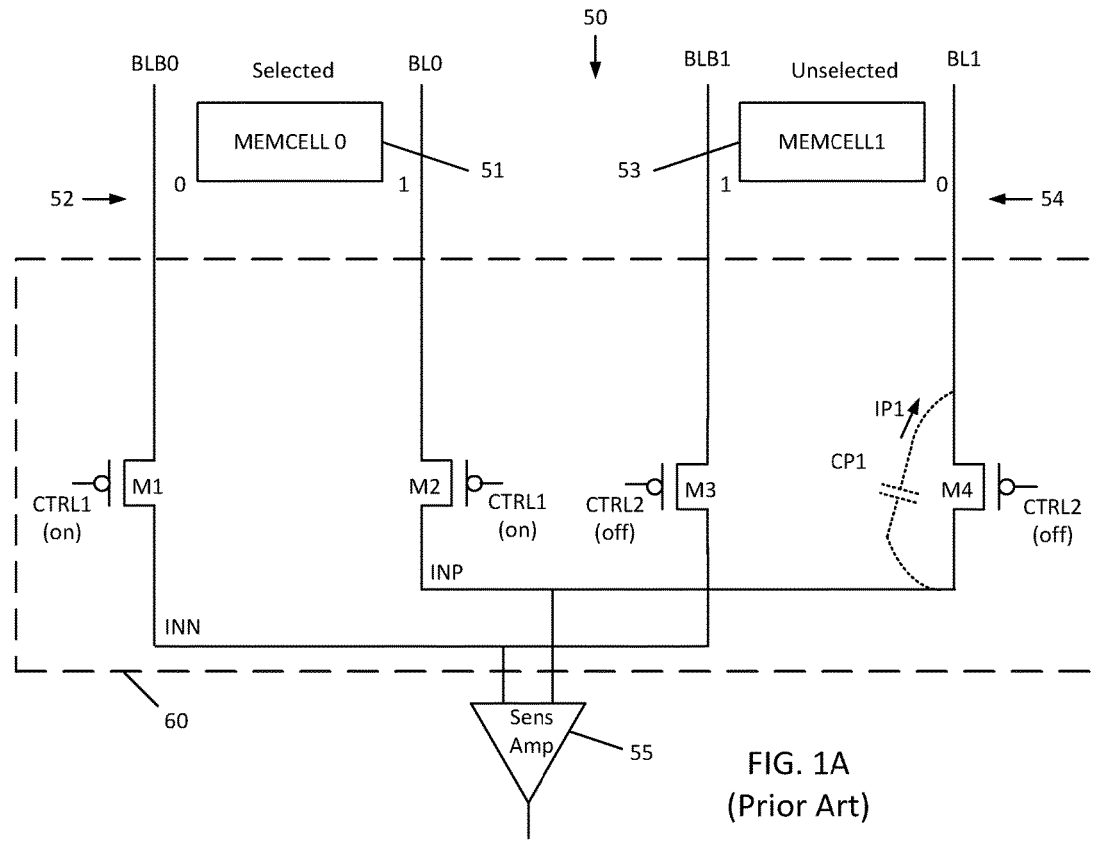
FIG. 1A is a schematic block diagram of a prior art SRAM memory device.
Figure 1B:
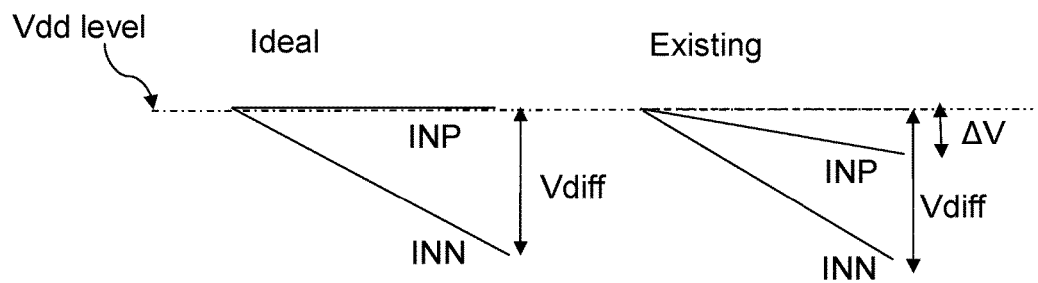
FIG. 1B is a graph showing ideal and actual operating voltages of the bit line and complementary bit line nodes of FIG. 1A.

The drawing figures and the following description relate to preferred embodiments by way of illustration only. It should be noted that from the following discussion, alternative embodiments of the structures and methods disclosed herein will be readily recognized as viable alternatives that may be employed without departing from the principles of the embodiments.

Reference will now be made in detail to several embodiments, examples of which are illustrated in the accompanying figures. It is noted that wherever practicable, similar or like reference numbers may be used in the figures and may indicate similar or like functionality. The figures depict embodiments for purposes of illustration only. As described herein, a "replica" transistor has a same length and width as the transistor it replicates, or has substantially similar or substantially identical electrical properties as the transistor it replicates.

Figure 2A:
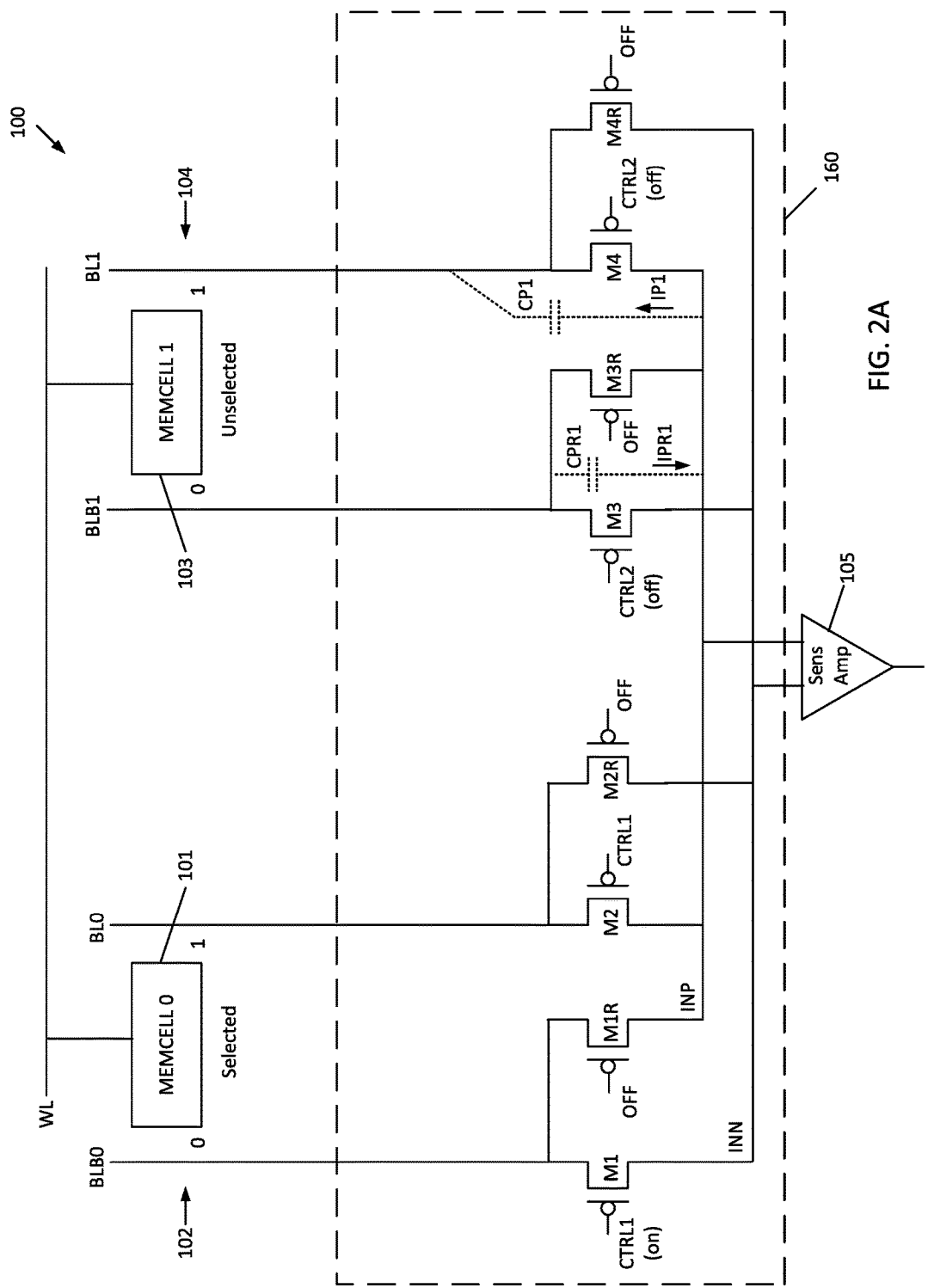
FIG. 2A is a schematic block diagram of an SRAM memory device in accordance with this disclosure in which the first column is selected, and in which the first bit line is intended to output a logic 1.

An SRAM memory circuit 100 is now described with reference to FIG. 2A. The SRAM memory circuit 100 includes first and second columns 102 and 104. The first column 102 includes memory cell 101 with a bitline BL0 and a complementary bitline BLB0 associated therewith. The column selection circuit 160 includes a PMOS transistor M1 with its source coupled to complementary bitline BLB0, its drain coupled to node INN, and its gate biased by control signal CTRL1. PMOS transistor M2 has its source coupled to bitline BL0, its drain coupled to node INP, and its gate biased by control signal CTRL1.

PMOS transistor M1R is a replica of transistor M1, has its source coupled to the source of transistor M1, its drain coupled to node INP, and its gate biased such that the PMOS transistor M1R is always off. PMOS transistor M2R is a replica of transistor M2, has its source coupled to the source of transistor M2, its drain coupled to node INN, and its gate biased such that the PMOS transistor M2R is always off.

The second column 104 includes memory cell 103 with bitline BL1 and complementary bitline BLB1 associated therewith. The column selection circuit 160 includes PMOS transistor M3 with its source coupled to complementary bitline BLB1, it drain coupled to node INN, and its gate biased by control signal CTRL2. PMOS transistor M4 has its source coupled to bitline BL1, its drain coupled to node INP, and its gate biased by control signal CTRL2.

PMOS transistor M3R is a replica of transistor M3, has its source coupled to the source of transistor M3, its drain coupled to node INP, and its gate biased such that the PMOS transistor M3R is always off. PMOS transistor M4R is a replica of transistor M4, has its source coupled to the source of transistor M4, its drain coupled to node INN, and its gate biased such that the PMOS transistor M4R is always off.

Nodes INN and INP serve as the outputs of the column selection circuit 160 and the inputs to sense amplifier 105. In operation, one column 102 or 104 is selected while the other column 102 or 104 is unselected. In the example operation state shown in FIG. 2A, column 102 is selected while column 104 is deselected and bitline BL0 is intended to output a logic 1 while complementary bitline BLB0 is intended to output a logic 0. This is accomplished by control signal CTRL1 going low to turn on bitline select transistors M1 and M2, while control signal CTRL2 goes high to turn off bitline select transistors M3 and M4.

Memory cells 101 and 103 can take either a "0" and "1" state based on the data stored in the memory. For example, if memory cell 101 stores a "0", and it is selected for a read operation, then bitline BL0 will discharge towards ground and complementary bitline BLB0 will remain at VDD. Similarly, if memory cell 101 were to store "1", BLB0 will discharge and BL0 will remain at VDD. The same operation applies with memory cell 103, where if memory cell 103 stores "0" and is selected for read, then bitline BL1 will discharge towards ground and complementary bitline BLB1 will remain at VDD. Similarly, if memory cell 103 stores "1", BLB1 will discharge and BL1 will remain at VDD With reference to FIG. 2A, consider the case when memory cells 101 and 103 store the same value "0" or "1", and whichever column is selected among 102 and 104, Vdiff (the difference between the voltage at INP and INN) does not reduce. This can be explained by considering that if memory cells 101 and 103 both store the same value "0" and memory cell 101 is selected for read by control signal CTRL1, then BL1 and BL0 both will discharge. BL1 and BL0 both are connected to node INP by transistors M4 and M2 respectively, since M4 is turned off by control signal CTRL2, due to parasitic capacitance CP1 between BL1 and INP, discharge of BL1 helps BL0 to discharge more and hence increases Vdiff. This is also the case where memory cells 101 and 103 both store a same value "1".

Figure 3A:
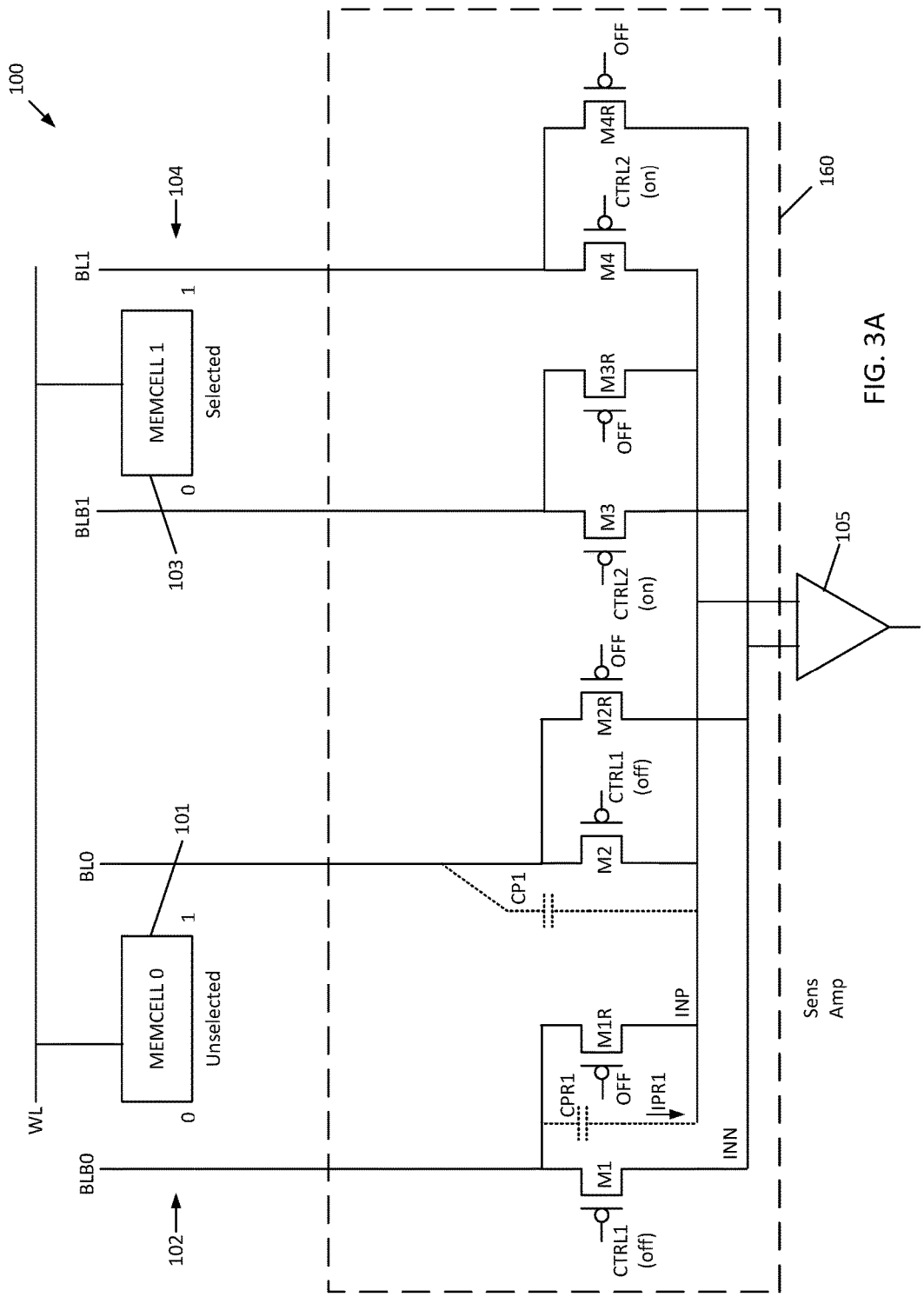
FIG. 3A is a schematic block diagram of an SRAM memory device in accordance with this disclosure in which the second column is selected, and in which the second bit line is intended to output a logic 1.

With reference to FIG. 3A, also consider the case when memory cells 101 and 103 store the same value "0" or "1", and whichever column is selected among 102 and 104, Vdiff (the difference between the voltage at INP and INN) does not reduce. This can be explained by considering that if memory cells 101 and 103 both store the same value "0" and memory cell 103 is selected for read by control signal CTRL2, then BL1 and BL0 both will discharge. BL1 and BL0 both are connected to node INP by transistors M4 and M2 respectively, since M2 is turned off by control signal CTRL1; due to parasitic capacitance CP1 between BL0 and INP, discharge of BL0 helps BL1 to discharge more and hence increases Vdiff. This is also the case where memory cells 101 and 103 both store a same value "1".

Figure 2B:
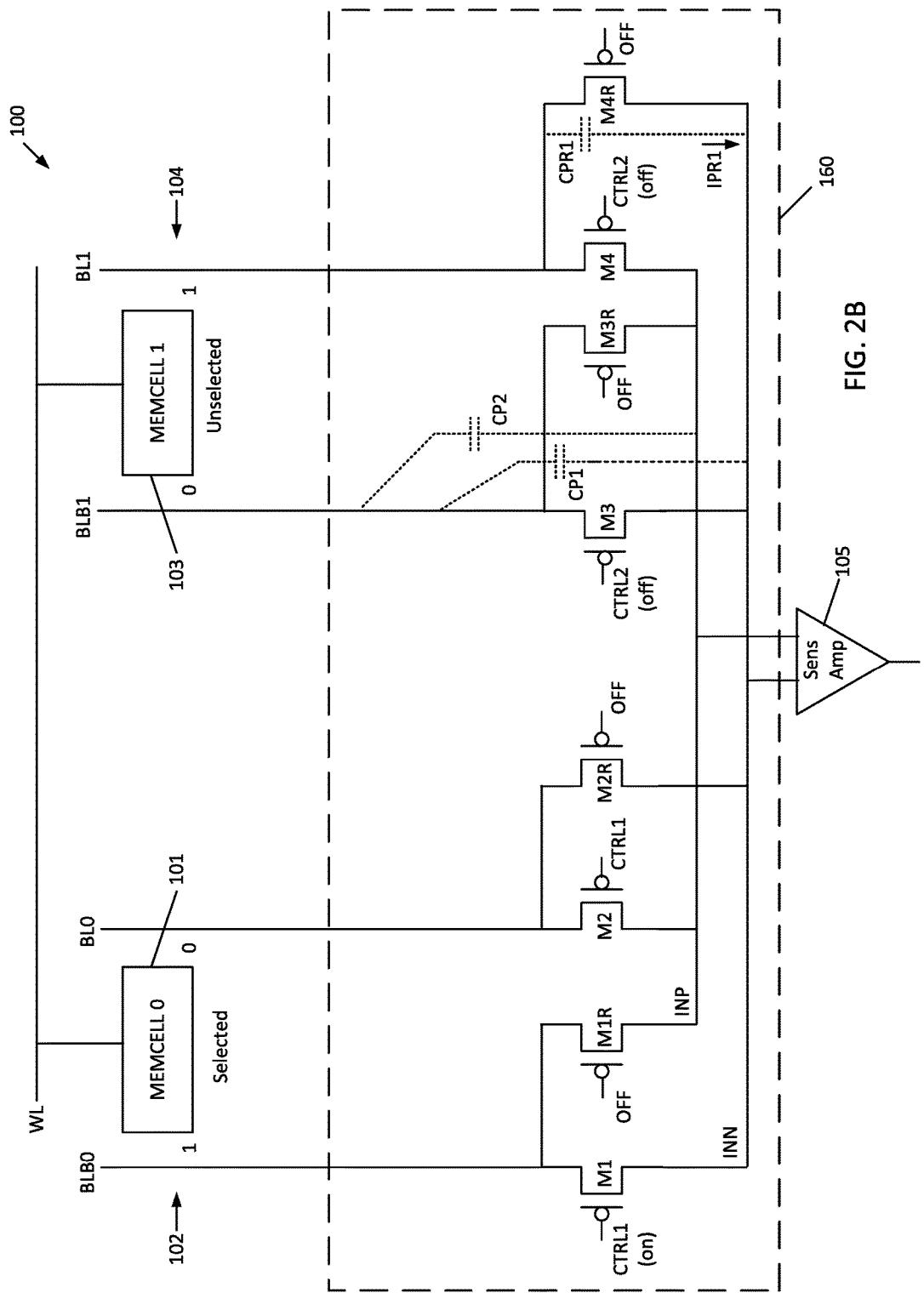
FIG. 2B is a schematic block diagram of an SRAM memory device in accordance with this disclosure in which the first column is selected, and in which the first bit line is intended to output a logic 0.

Thus, Vdiff loss occurs when memory cells 101 and 103 store opposite values (such as the case shown in FIG. 2B).

In the proposed circuit, the Vdiff loss is compensated by adding replica transistor M1R and M2R in column 102 and M3R and M4R in column 104. In FIG. 2B, the compensation of loss in Vdiff can be explained by considering the case when cell 101 storeS "0" and cell 103 storeS "1". Column 102 is selected by control signal CTRL1, BL0 discharges towards ground level so the nodes INP, INN are supposed to remain at VDD because BLB0 does not discharge and remains at VDD. However, due to parasitic capacitance CP1 between INN and BLB1, INN also discharges towards ground level due to coupling because BLB1 discharges. This coupling is compensated by the replica transistor M3R. M3R is in OFF state and it provides the same parasitic capacitance CP2 between BLB1 and INP as M3 introduces between BLB1 and INN. Thus, node INP discharges towards the ground level due to the parasitic capacitance of replica transistor M3R by the same amount as INN discharges towards ground level due to the parasitic capacitance of transistor M3.

Figure 3B:
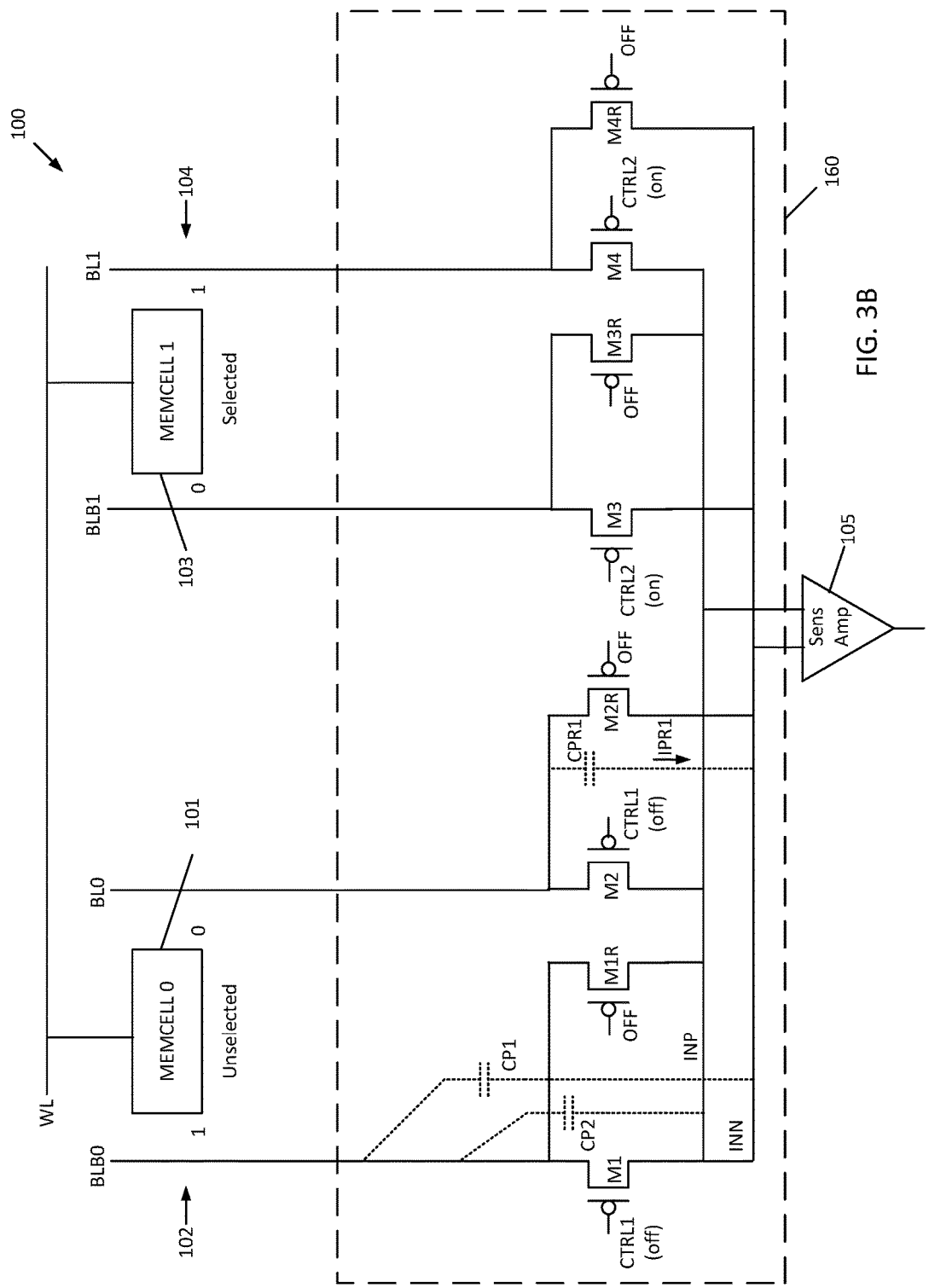
FIG. 3B is a schematic block diagram of an SRAM memory device in accordance with this disclosure in which the second column is selected, and in which the second bit line is intended to output a logic 0.

Similarly, in FIG. 3B, column 104 is selected by control signal CTRL2, BL1 discharges towards ground level so the nodes INP, INN are supposed to remain at VDD because BLB1 does not discharge and remains at VDD. However, due to parasitic capacitance CP1 between INN and BLB0, INN also discharges towards ground level due to coupling because BLB0 discharges. This coupling is compensated by the replica transistor M1R. M1R is in OFF state and it provides the same parasitic capacitance CP2 between BLB0 and INP as M1 introduces between BLB0 and INN. Thus, node INP discharges towards the ground level due to the parasitic capacitance of replica transistor M1R by the same amount as INN discharges towards ground level due to the parasitic capacitance of transistor M1.

In addition to the above, the transistors M1-M4 and M1R-M4R may be reduced in size compared to conventional SRAM circuits, for example being 50% of the usual size.

Upon reading this disclosure, those of ordinary skill in the art will appreciate still additional alternative structural and functional designs through the disclosed principles of the embodiments. Thus, while particular embodiments and applications have been illustrated and described, it is to be understood that the embodiments are not limited to the precise construction and components disclosed herein and that various modifications, changes and variations which will be apparent to those skilled in the art may be made in the arrangement, operation and details of the method and apparatus disclosed herein without departing from the spirit and scope as defined in the appended claims.

The invention claimed is:

1. An electronic device, comprising:
a sense amplifier having first and second inputs;
a first column coupled to the first and second inputs of the sense amplifier, the first column comprising:
a first memory cell coupled to a first bitline;
a first transistor coupled between the first bitline and the first input of the sense amplifier; and
a first replica transistor coupled between the first bitline and the second input of the sense amplifier, wherein the first replica transistor is a replica of the first transistor; and
a second column coupled to the first and second inputs of the sense amplifier.

2. The electronic device of claim 1, wherein the first transistor provides an unwanted parasitic coupling the first bitline to the first input of the sense amplifier when the second column is selected for a read operation, and wherein the first replica transistor provides a compensating parasitic capacitance coupling the first bitline to the second input of the sense amplifier when the second column is selected for the read operation.

3. The electronic device of claim 1, wherein the first transistor and first replica transistor are PMOS transistors.

4. The electronic device of claim 1, wherein the first replica transistor is configured to be turned off at least when the second column is selected for a read during operation.

5. The electronic device of claim 4, wherein the first replica transistor is configured to be turned off at all times.

6. The electronic device of claim 1, wherein the second column comprises:
a second memory cell coupled to a second bitline;
a second transistor coupled between the second bitline and the first input of the sense amplifier; and
a second replica transistor coupled between the second bitline and the second input of the sense amplifier, the second replica transistor being a replica of the second transistor.

7. The electronic device of claim 6, wherein the second transistor provides an unwanted parasitic coupling the second bitline to the first input of the sense amplifier when the first column is selected for a read operation, and wherein the second replica transistor provides a compensating parasitic capacitance coupling the second bitline to the second input of the sense amplifier when the first column is selected for the read operation.

8. An electronic device, comprising:
a sense amplifier having first and second inputs; and
a first column comprising:
a first memory cell coupled to a first bitline and a first complementary bitline;
a first read transistor coupled between the first complementary bitline and the second input of the sense amplifier;
a first replica transistor coupled between the first complementary bitline and the first input of the sense amplifier, wherein the first replica transistor is a replica of the first read transistor;
a second read transistor coupled between the first bitline and the first input of the sense amplifier; and
a second replica transistor coupled between the first bitline and the second input of the sense amplifier, wherein the second replica transistor is a replica of the second read transistor;
wherein the first and second replica transistors have control terminals coupled to a fixed voltage node.

9. The electronic device of claim 8, wherein a voltage at the fixed voltage node biases the first and second replica transistors to be off at all times.

10. The electronic device of claim 8, wherein the first and second read transistors and the first and second replica transistors are all PMOS transistors.

11. The electronic device of claim 8, further comprising a second column having:
a second memory cell coupled to a second bitline and a second complementary bitline;
a third read transistor coupled between the second complementary bitline and the second input of the sense amplifier;
a third replica transistor coupled between the second complementary bitline and the first input of the sense amplifier, wherein the third replica transistor is a replica of the third read transistor;
a fourth read transistor coupled between the second bitline and the first input of the sense amplifier; and
a fourth replica transistor coupled between the second bitline and the second input of the sense amplifier, wherein the fourth replica transistor is a replica of the fourth read transistor;
wherein the third and fourth replica transistors have control terminals coupled to the fixed voltage node.

12. An electronic device, comprising:
a sense amplifier having a non-inverting input and an inverting input; and a first column comprising:
  a first memory cell coupled to a first bitline and a first complementary bitline;
  a first read PMOS transistor having a source coupled to the first complementary bitline, a drain coupled to the inverting input of the sense amplifier, and a gate coupled to a first control signal node; and
  a first replica transistor having a source coupled to the first complementary bitline, a drain coupled to the non-inverting input of the sense amplifier, and a gate coupled to a power supply node, wherein the first replica transistor is a replica of the first read PMOS transistor;
  a second read PMOS transistor having a source coupled to the first bitline, a drain coupled to the non-inverting input of the sense amplifier, and a gate coupled to the first control signal node; and
  a second replica transistor having a source coupled to the first bitline, a drain coupled to the inverting input of the sense amplifier, and a gate coupled to the power supply node, wherein the second replica transistor is a replica of the second read PMOS transistor.

13. The electronic device of claim 12, further comprising a second column, wherein the second column comprises:
  a second memory cell coupled to a second bitline and a second complementary bitline;
  a third read PMOS transistor having a source coupled to the second complementary bitline, a drain coupled to the inverting input of the sense amplifier, and a gate coupled to a second control signal node;
  a third replica transistor having a source coupled to the second complementary bitline, a drain coupled to the non-inverting input of the sense amplifier, and a gate coupled to the power supply node, wherein the third replica transistor is a replica of the third read PMOS transistor;
  a fourth read PMOS transistor having a source coupled to the second bitline, a drain coupled to the non-inverting input of the sense amplifier, and a gate coupled to the second control signal node; and
  a fourth replica transistor having a source coupled to the second bitline, a drain coupled to the inverting input of the sense amplifier, and a gate coupled to the power supply node, wherein the fourth replica transistor is a replica of the fourth read PMOS transistor.

14. The electronic device of claim 12, wherein a voltage at the power supply node drives the first and second replica transistors to be in an off state.

15. A method, comprising:
  selecting a first memory column to connect first and second bitlines of the first memory column to first and second inputs of a sense amplifier;
  deselecting a second memory column to disconnect first and second bitlines of the second memory column from the first and second inputs of the sense amplifier; and
  compensating for an unwanted parasitic capacitive coupling between the first bitline of the second memory column and the first input of the sense amplifier by providing a compensating capacitive coupling between the first bitline of the second memory column and the second input of the sense amplifier.

16. The method of claim 15, wherein deselecting comprises selectively turning off a first transistor coupled between the first bitline of the second memory column and the first input of the sense amplifier and selectively turning off a second transistor coupled between the second bitline of the second memory column and the second input of the sense amplifier.

17. The method of claim 16, wherein providing the compensating capacitive coupling comprises providing a first replica transistor coupled between the first bitline of the second memory column and the second input of the sense amplifier.

18. The method of claim 17, further comprising controlling the first replica transistor to be in an off state.

19. The method of claim 18, wherein controlling comprises placing the first replica transistor in the off state when selecting the first memory column to connect first and second bitlines of the first memory column to first and second inputs of the sense amplifier.

20. The method of claim 15, wherein the unwanted parasitic capacitive coupling passes a current from the first bitline of the second memory column, and wherein the compensating capacitive coupling passes a compensating current to the first bitline of the second memory column.

21. The method of claim 20, wherein the passed current causes a lowering of a voltage on the first bitline of the second memory column and the passed compensating current causes an increase in the voltage on the first bitline of the second memory column.

* * * * *